United States Patent [19]

Kim et al.

[11] Patent Number: 5,159,574
[45] Date of Patent: Oct. 27, 1992

[54] ADDRESS TRANSITION DETECTION CIRCUIT

[75] Inventors: Young H. Kim, Namku; Hong S. Kim, Icheonkun, both of Rep. of Korea

[73] Assignee: Hyundai Electronics Industries Co., Ltd., Kyoungkido, Rep. of Korea

[21] Appl. No.: 798,634

[22] Filed: Nov. 26, 1991

[30] Foreign Application Priority Data

Nov. 30, 1990 [KR] Rep. of Korea .............. 1990-19625

[51] Int. Cl.⁵ .................................................. G11C 8/00
[52] U.S. Cl. .................................. 365/233.5; 365/154; 365/194; 307/263; 307/471; 307/481; 307/517; 328/110
[58] Field of Search .............. 365/154, 194, 233.5; 307/471, 472, 481, 263, 510, 517; 328/110, 114, 132

[56] References Cited

U.S. PATENT DOCUMENTS 4,592,028  5/1986  Konishi ...................... 365/233.5
4,843,596  6/1989  Miyatake et al. ............ 365/233.5

Primary Examiner—Joseph E. Clawson, Jr.
Attorney, Agent, or Firm—Darby & Darby

[57] ABSTRACT

The present invention provides an address transition detection circuit comprising inverting means (11 and G12 through G14) and a MOSFET's circuit which is composed of two cross-coupled MOSFET's (MN5 and MN6), first and second MOSFET's (MP2 and MP3) connected in series with each other, and third and fourth MOSFET's (MP4 and MP5) connected in series with each other, wherein the output lines of each inverter within the inverting means.

2 Claims, 4 Drawing Sheets

ADDRESS TRANSITION DETECTION CIRCUIT

BACKGROUND OF THE INVENTION

The present invention relates to the memory device, and more particularly to an address transition detection circuit generating pulses of a given width by detecting the transitions of the address signal being inputted.

The prior art in this circuit is shown in FIG. 1 through FIG. 3. As shown in FIG. 1, the prior circuit is composed of an inverter G1, a delay chain circuit 1, and an exclusive OR gate 1. As shown in FIG. 2 the circuit can obtain the address transition detection output-(ATD) from the inputted address(Ai). In FIG. 3, in case that the address (Ai) makes a transition from high to low, the n channel MOSFETs(MN1,MN2) are turned ON, and then the current path is formed from the voltage source(Vcc) to the ground through the p channel transistor (MP1). In case that the address (Ai) makes a transition from low to high, the n channel MOSFETs (MN3,MN4) are turned ON, and then the current path is formed from the voltage source(Vcc) to the ground through the p channel MOSFET (MP1). Accordingly, this circuit had the problem for power loss because it had the ground node for performing logic operation.

SUMMARY OF THE INVENTION

It is an object of the invention to provide an address transition detection circuit for eliminating the power loss by blocking the current path for a period of generating the transition pulse.

To achieve said object, the invention provides an address transition detection circuit comprising inverting means and a MOSFET's circuit which is composed of two cross coupled MOSFET's, first and second MOSFET's connected in series with each other, and third and fourth MOSFET's connected in series with each other, wherein the gates thereof are respectively connected to the output lines of the inverters within the inverting means.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1:
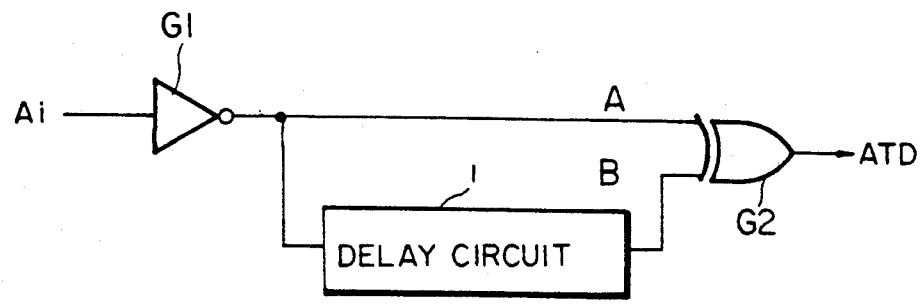
FIG. 1 through FIG. 3 are diagrams of showing the prior art.
Figure 2:
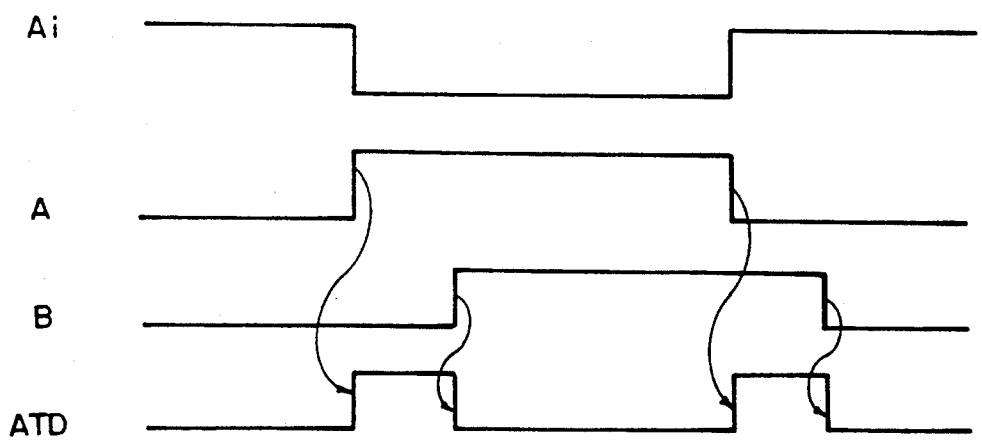
Figure 3:
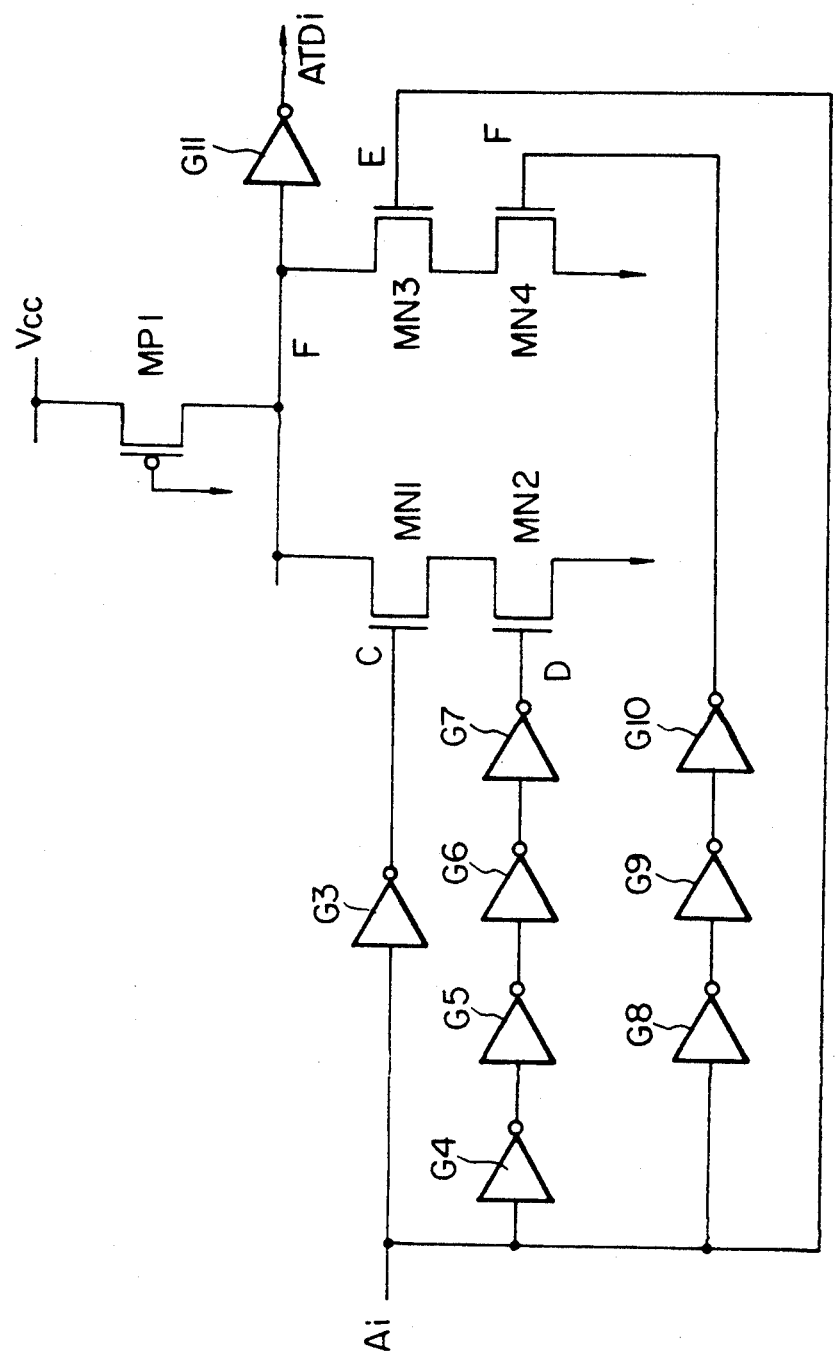
Figure 4A:
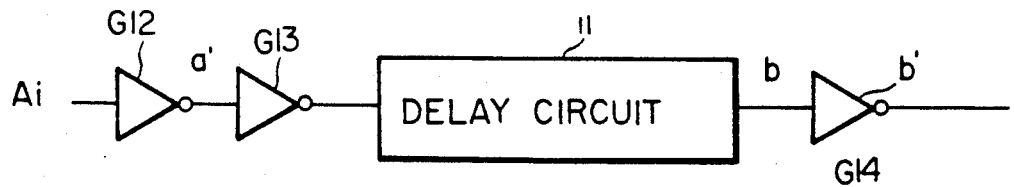
FIG. 4A, FIG. 4B and FIG. 5 are diagrams of showing one embodiment of the invention.
Figure 4B:
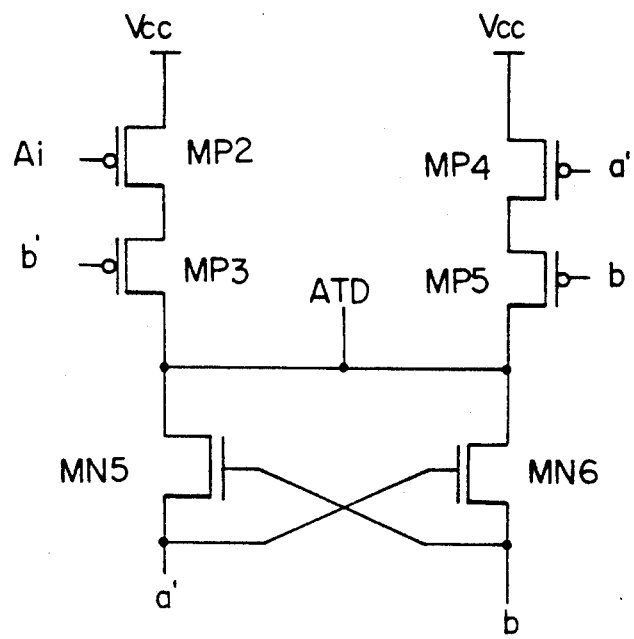
Figure 5:
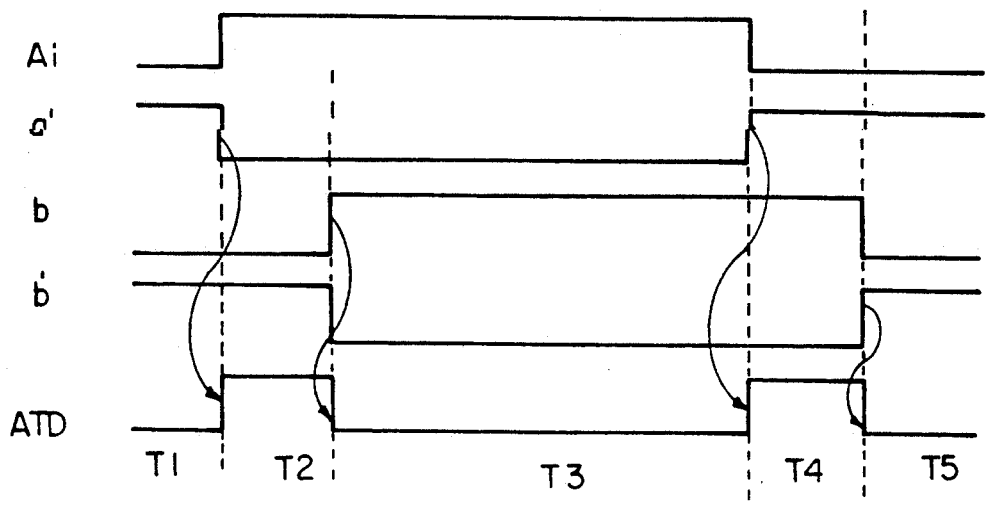

FIG. 4A and FIG. 4B are circuit diagrams of showing an embodiment of the invention, and FIG. 5 is a signal waveform diagram of the FIG. 4A and FIG. 4B. In the drawings, the reference number 11 shows a delay chain circuit, G12 through G14 inverters, MN5 and MN6 n channel MOSFET's, and MP2 through MP5 p channel MOSFET's, respectively.

In the embodiment, the circuit is composed of inverting means and MOSFET circuit. The inverting means composed of the inverter (G12) inputting the address signal (Ai), the inverter (G13) connected to the inverter (G12), the delay circit 11 connected to the inverter (G13), and the inverter (G14) connected to the delay circuit 11. The MOSFET circuit is composed of the p channel MOSFET(MP2) which the gate thereof is connected to the input address line and the source thereof is connected to the voltage source(Vcc), the p channel MOSFET(MP3) which the gate thereof is connected to the output line (b') of the inverter(G14) and the source thereof is connected to the drain of the MOSFET(MP2), the p channel MOSFET(MP4) which the gate thereof is connected to the output line(a') of the inverter (G12) and the source thereof is connected to the voltage source (Vcc), the p channel MOSFET(MP5) which the gate thereof is connected to the output line(b) of the delay circuit 11 and the source thereof is connected to the drain of the p channel MOSFET(MP4), the n channel MOSFET(MN5) which the gate thereof is connected to the output line(b) of the delay circuit 11, the drain thereof is connected to the drain of the p channel MOSFET(MP3) and the source thereof is connected to the output line(a') of the inverter (G12), and the n channel MOSFET(MN6) which the gate thereof is connected to the output line(a') of the inverter (G12), the drain thereof is connected to the drain of the MOSFET(MP5) and the source thereof is connected to the output line (b) of the delay circuit 11. And here the n channel MOSFET's (MN5,MN6) are cross-coupled with each other.

In the period (T1) of FIG. 5, the address signal (Ai) is changed to the low level, the output line (b') of the inverter (G14) is turned to the high level, and then the n channel MOSFET (MN6) is turned ON in the state blocking the current path from the voltage source(Vcc) to the output line (ATD). At this line the output line (ATD) is turned to the low state.

In the period (T2), the address signal (Ai) is changed to the high level, the output line (a') of the inverter (G12) and the output line (b) of the delay circuit 11 are turned to the low level, and then the cross-coupled n channel MOSFET's(MN5,MN6) are turned OFF. At this time, the output line (ATD) is turned to the high level.

In the period (T3), the output line (b) of the delay circuit 11 is changed to the high level in the state that the address (Ai) line keeps the high level, and the n channel MOSFET(MN5) is turned ON in the state blocking the current path from the voltage source (Vcc) to the output line (ATD), and then the output line-(ATD) is turned to the low state.

In the period (T4), the address signal(Ai) is changed to the low level, the output line (b') of the inverter (G14) is turned to the low level, and then the p channel MOSFET's(MP2,MP3) are turned ON. At this time, the output line (ATD) is turned to the high level.

In the period (T5), the output line(a') of the inverter (G12) is changed to the high level in the state that the address signal(Ai) line keeps the low level, the output line (b) of the delay circuit 11 is turned to the low level, and then the n channel MOSFET(MN6) is turned ON. At this time, the output line(ATD) is turned to the low level.

Figure 6A:
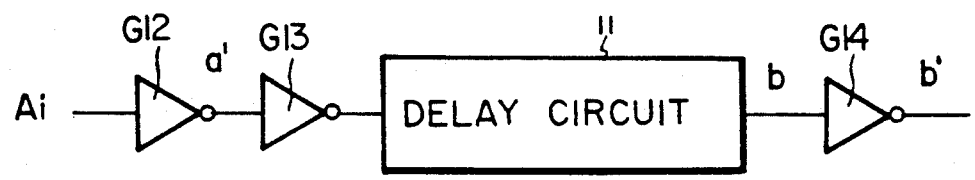
FIG. 6A, FIG. 6B and FIG. 7 are diagrams of showing another embodiment of the invention.
Figure 6B:
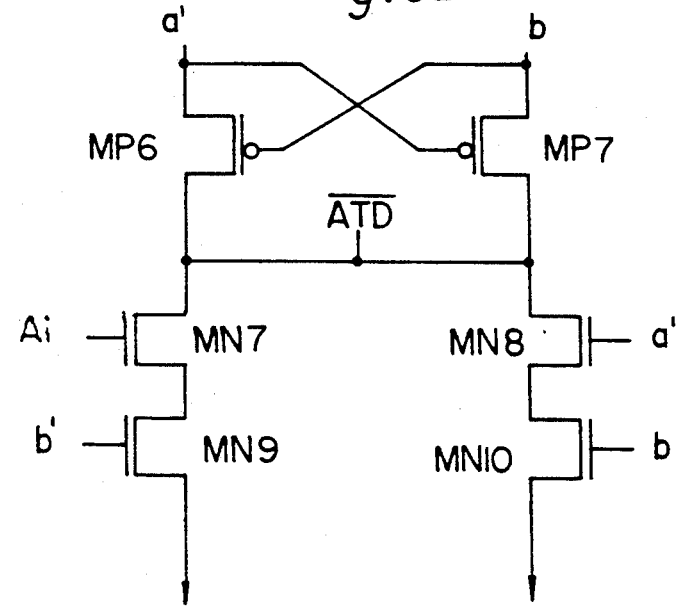
Figure 7:
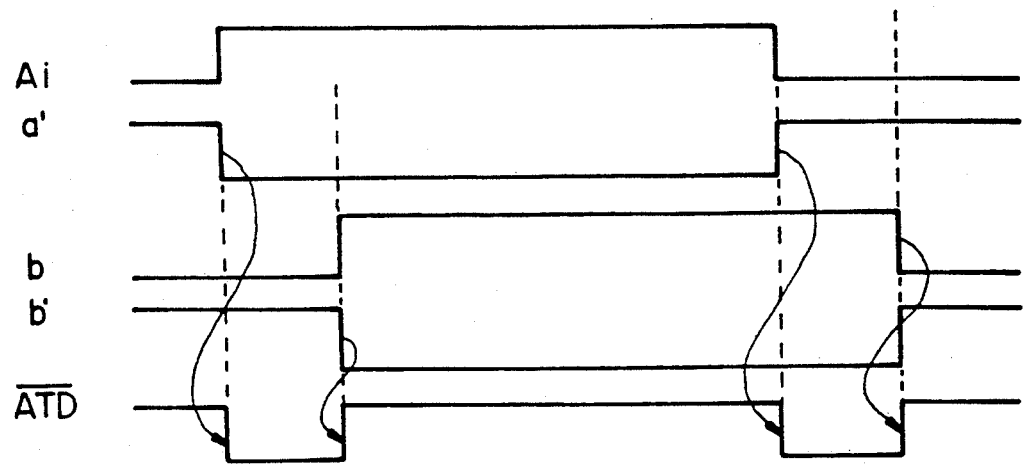

FIG. 6A and FIG. 6B are circuit diagrams of showing another embodiment and FIG. 7 is a signal waveform diagram of FIG. 6A and FIG. 6B. In the drawings, the reference MP6 and MP7 show p channel MOSFET's, MN7 through MN10 n channel MOSFET's, respectively, and the same reference in FIG. 4A and FIG. 4B shows the same device. The circuit of this embodiment is basically the same as the circuit of FIG.

4A and FIG. 4B and is to comprise the MOSFET's circuit again by inverting just the polarity of the MOSFET device in comparison with the FIG. 4A and FIG. 4B. That is, the p channel MOSFET's(MP2 through MP5) in FIG. 4A and FIG. 4B are respectively replaced with the n channel MOSFET's(MN7 through MN10), and the n channel MOSFET's(MN5,MN6) are respectively replaced with the p channel MOSFET's(MP6,MP7) in this embodiment. And accordingly the output line($\overline{ATD}$) as shown in FIG. 7 shows the inverted state that inverts the state of the output line (ATD) of FIG. 5.

What is claimed is:

1. An address transition detection circuit in a memory device, comprising:
   an address input line;
   a first inverter connected to the address input line;
   a second inverter connected to the first inverter;
   a delay circuit connected to the second inverter;
   a third inverter connected to the delay circuit;
   a first p channel MOSFET and a second p channel MOSFET connected in series with each other, in which the gate of the first p channel MOSFET is connected to the address input line and the gate of the second p channel MOSFET is connected to the output line of the third inverter;
   a third p channel MOSFET and a fourth p channel MOSFET connected in serial with each other, in which the gate of the third p channel MOSFET is connected to the output line of the first inverter and the gate of the fourth p channel MOSFET is connected to the output line of the delay circuit; and
   a first n channel MOSFET and a second n channel MOSFET cross-coupled with each other, in which the drains thereof respectively connected to the drains of the second and the fourth p channel MOSFET's, the source of the first n channel MOSFET is connected to the output line of the first inverter, and the source of the second n channel MOSFET is connected to the output line of the delay circuit.

2. An address transition detection circuit in a memory device, comprising:
   an address input line;
   a first inverter connected to the address input line;
   a second inverter connected to the first inverter;
   a delay circuit connected to the second inverter;
   a third inverter connected to the delay circuit;
   a first n channel MOSFET and a second n channel MOSFET connected in serial with each other, in which the gate of the first n channel MOSFET is connected to the address input line and the gate of the second n channel MOSFET is connected to the output line of the third inverter;
   a third n channel MOSFET and a fourth n channel MOSFET connected in series with each other, in which the gate of the third n channel MOSFET is connected to the output line of the first inverter and the gate of the fourth n channel MOSFET is connected to the output line of the delay circuit; and
   a first p channel MOSFET and a second p channel MOSFET cross-coupled with each other, in which the drains thereof are respectively connected to the drains of the first and the third n channel MOSFET's, the source of the first p channel MOSFET is connected to the output line of the first inverter, and the source of the second p channel MOSFET is connected to the output line of the delay circuit.

* * * * *